United States Patent [19]
Yamamoto et al.

[11] Patent Number: 4,855,795
[45] Date of Patent: Aug. 8, 1989

[54] PHOTOSENSOR

[75] Inventors: Hideaki Yamamoto, Tokorozawa; Akira Sasano, Tokyo; Haruo Matsumaru, Tokyo; Yasuo Tanaka, Tokyo; Toshihisa Tsukada, Tokyo, all of Japan

[73] Assignee: Hitachi, Ltd., Tokyo, Japan

[21] Appl. No.: 898,540

[22] Filed: Aug. 21, 1986

[30] Foreign Application Priority Data

Sep. 24, 1985 [JP] Japan .................. 60-208646

[51] Int. Cl.⁴ ............................................. H01L 45/00
[52] U.S. Cl. ............................................. 357/2; 357/30
[58] Field of Search ............ 357/2, 30 K, 30 E, 30 H, 357/30 J, 4

[56] References Cited

U.S. PATENT DOCUMENTS

| | | | |
|---|---|---|---|
| 3,864,725 | 2/1975 | Merrin | 357/30 |
| 3,886,587 | 5/1975 | Nicolay | 357/30 H |
| 4,520,380 | 5/1985 | Ovshinsky | 357/2 |
| 4,532,373 | 7/1985 | Malsura et al. | 357/30 K |
| 4,557,987 | 12/1985 | Shirai et al. | 357/30 |
| 4,641,168 | 2/1987 | Yamazaki et al. | 357/30 K |
| 4,658,280 | 4/1987 | Komatsu et al. | 357/2 |

FOREIGN PATENT DOCUMENTS 219970 12/1984 Japan .................. 357/30

OTHER PUBLICATIONS

"Amorphous Silicon Solar Cell", Carlson et al. Applied Physics Letters vol. 28, No. 11, 1976, pp. 671-673.

*Primary Examiner*—Martin H. Edlow
*Attorney, Agent, or Firm*—Antonelli, Terry & Wands

[57] ABSTRACT

A photosensor comprises an insulating substrate, an electrode, a photoconductor layer composed of a hydrogenated amorphous silicon semiconductor layer obtained by the glow discharge decomposition of monosilane gas, a junction stabilizing layer composed of a boron-containing hydrogenated amorphous silicon semiconductor which is obtained by the glow discharge decomposition of a mixed gas of monosilane and diborane, a transparent electrode and a transparent protective layer, these elements being laminated in that order. The insertion of the junction stabilizing layer between the photoconductor layer and the transparent electrode greatly improves the dark current characteristic. The electrode, the photoconductor layer and the junction stabilizing layer can be divided in correspondence with each picture element, thereby improving the resolution of the photosensor.

8 Claims, 5 Drawing Sheets

PHOTOSENSOR

BACKGROUND OF THE INVENTION

The present invention relates to a photosensor such as a photoelectric transducer element in which hydrogenated amorphous silicon is used and a one-dimensional image sensor in which the photoelectric transducer is used.

As a one-dimensional image sensor in which hydrogenated amorphous silicon is used, a photoelectric transducer element having a structure of metal-/a—Si:H/ITO (Indium Tin Oxide) such as that described in Japanese Patent Laid-Open No. 84457/1983 is often utilized. Such a photoelectric transducer element is shown in FIG. 1. Hydrogenated amorphous silicon is usually indicated by a—Si:H, as described above. In FIG. 1, the reference numeral 1 denotes an insulating substrate, 2 a metal electrode, 3 a hydrogenated amorphous silicon film obtained by the glow discharge decomposition of SiH$_4$ gas, and 4 an ITO electrode. Indium tin oxide is transparent, and the ITO electrode 4 is therefore transparent. Although a photoelectric transducer element having this structure has good properties, it is necessary to form a transparent protective film 5 on the photoelectric transducer element, as shown in FIG. 2, when it is practically used. Si$_3$N$_4$, SiO$_2$ and the like are commonly used for the protective film. It has been found, however, when the protective film is actually formed on the above-described photoelectric transducer element, the properties are greatly deteriorated, as shown in FIG. 3. FIG. 3 shows the properties in the dark of the photoelectric transducer element having the structure shown in FIG. 1. FIG. 3 shows the reverse current which flows when the voltage which is ordinarily applied to ITO, namely, a voltage of 0 to 7 V is applied to the ITO electrode of the negative polarity. In an ordinary one-dimensional image sensor, the reverse current is preferably at most $10^{-9}$ A/cm$^2$. The line l$_1$ in FIG. 3 shows the property before the formation of the protective film, the property being very good. On the other hand, when an Si$_3$N$_4$ film or SiO$_2$ film is formed, the property becomes degraded by more than 1,000 times, as indicated by the line l$_2$. This degraded property precludes the utility of the photoelectric transducer element. The degradation of the property is considered to be because the junction property of the interface between the a—Si and ITO is deteriorated due to the formation of an Si$_3$N$_4$ or SiO$_2$ film.

SUMMARY OF THE INVENTION

Accordingly, it is an object of the present invention to provide a high-performance photosensor such as a photoelectric transducer element and a one-dimensional image sensor which is free from the deterioration of properties caused by the formation of an Si$_3$N$_4$ or SiO$_2$ film and is highly reliable.

To achieve this aim, a photosensor according to the present invention comprises: an insulating substrate; a conductor electrode; a photoconductor layer consisting essentially of a hydrogenated amorphous silicon semiconductor; a junction stabilizing layer consisting essentially of a hydrogenated silicon semiconductor which contains boron; a transparent electrode; and a transparent protective film, these elements being laminated in that order. The thickness y (Å) of the junction stabilizing layer satisfies the condition xy<15, wherein x represents the boron content in the junction stabilizing layer in vol% (the unit vol% of the boron content will be explained later), and is at least 150Å thick.

The photoconductor layer is made of known a—Si:H and the junction stabilizing layer is made of the known a—Si:H with boron added thereto.

As a material of the transparent electrode, known ITO is ordinarily used, and as a material of the transparent protective film, silicon nitride Si$_3$N$_4$ or silicon oxide SiO$_2$ is ordinarily used.

When a photosensor is employed in a state divided in correspondence with each picture element, in the photosensor in accordance with the present invention, not only the conductor electrode but also the photoconductor layer and the junction stabilizing layer are divided in the same way as the conduction electrode in correspondence with each element. In this case, the hydrogenated amorphous silicon layer of the photoconductor layer and boron-containing hydrogenated amorphous silicon layer of the junction stabilizing layer are divided into a plurality of islands. The size of the island is determined by the resolving power in accordance with the purpose of the photosensor. For example, the island is formed to be a square of 100 μm × 100 μm when the resolving power is 8 picture elements per mm. The resolution is enhanced by dividing the photoconductor layer and the junction stabilizing layer into islands in correspondence with each picture element in the aforementioned way. The hydrogenated amorphous silicon semiconductor layer (a—Si:H) which constitutes the photoconductor layer can be obtained by the glow discharge decomposition of monosilane gas SiH$_4$ to which other gas is not added intentionally. The temperature of the substrate is generally 200° to 300° C., and the hydrogen content of a—Si:H is 10 to 30 at %.

The glow discharge decomposition of mixed gas of monosilane and diborane B$_2$H$_6$ produces a—Si:H containing boron, which is used for the formation of the junction stabilizing layer. The temperature of the substrate and the hydrogen content in the deposited layer are the same as those in the layer which does not contain boron. It is difficult to determine the absolute value of boron. Therefore, the boron content in the deposited layer is represented in this specification in vol% which is the volume ratio of (B$_2$H$_6$)/(SiH$_4$) in the mixed gas, namely the boron content in vol% based on the amount of SiH$_4$ gas in the mixed gas. The boron content in the junction stabilizing layer is 0.02 to 0.1 vol%.

The above and other objects, features and advantages of the present invention will become clear from the following description of the preferred embodiments thereof, taken in conjunction with the accompanying drawings.

BRIEF DESCRIPTION OF THE DRAWINGS

FIG. 12b is a sectional view of the one-dimensional image sensor shown in FIG. 12a.

DESCRIPTION OF THE PREFERRED EMBODIMENTS

Figure 3:
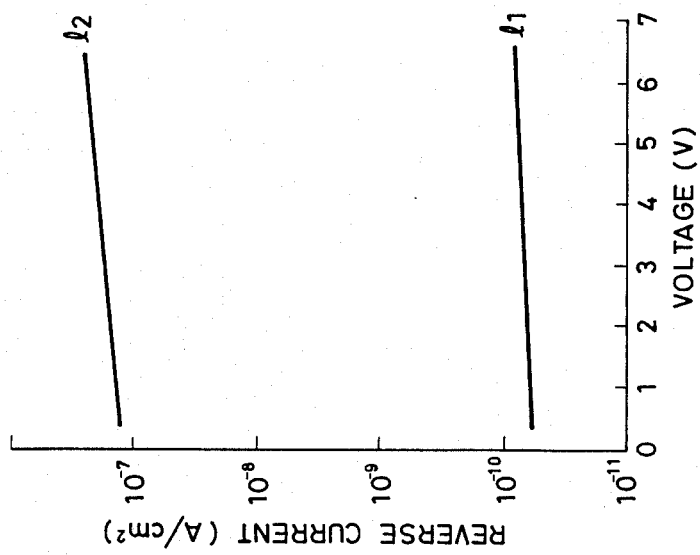
FIG. 3 is a graph showing the dark current characteristic of a photoelectric transducer element in the prior art.
Figure 1:
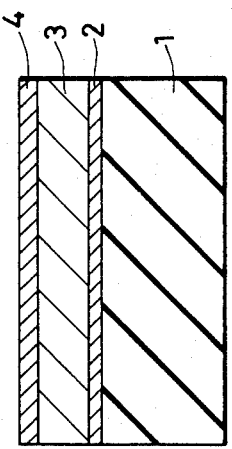
FIGS. 1 and 2 are sectional views of a photoelectric transducer element in the prior art.
Figure 2:
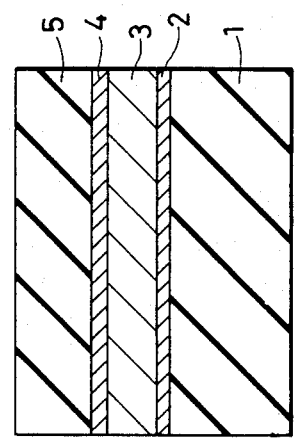
Figure 4:
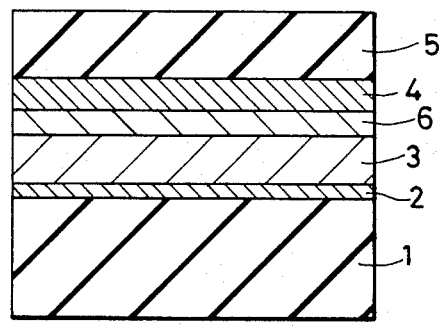
FIG. 4 is a sectional view of the fundamental structure of a photosensor in accordance with the present invention.
Figure 5:
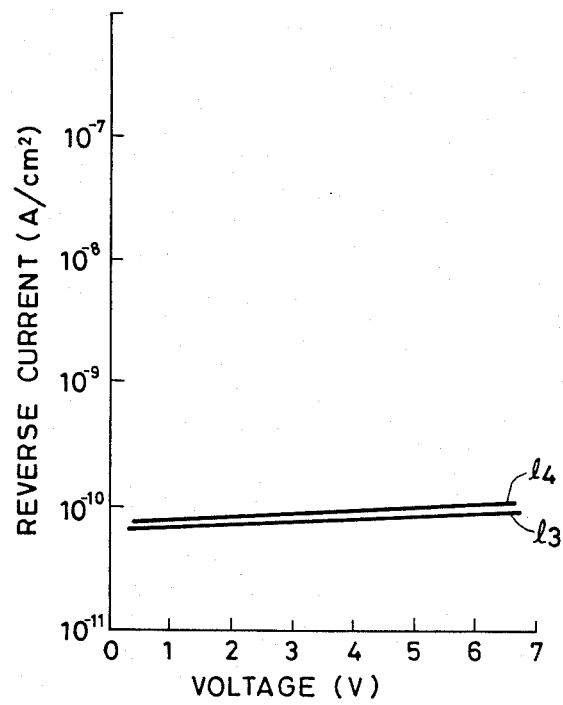
FIG. 5 is a graph showing the dark current characteristic of a photosensor of an embodiment in accordance with the present invention.

As a result of various studies into how to realize a photoelectric transducer element which is free from deterioration of properties caused by the formation of a protective film such as an $Si_3N_4$ or $SiO_2$ film, the present inventors have found that this aim is achieved by making a hydrogenated amorphous silicon layer in two layers; that is, a first layer 3 which is in contact with a lower electrode, namely, the conductor layer 2, and a second layer 6 which is in contact with an ITO layer, namely, the transparent electrode 4, as shown in FIG. 4; wherein the first layer 3 is composed of hydrogenated amorphous silicon (a—Si:H) which is obtained by the glow discharge decomposition of $SiH_4$ gas alone as in the prior art, while the second layer 6 is composed of boroncontaining a—Si:H which is obtained by the glow discharge decomposition of a mixed gas of $SiH_4$ gas and $B_2H_6$ gas. This is apparent from FIG. 5. FIG. 5 shows the reverse current flowing when the negative voltage is applied to the ITO electrode 4 in the dark, employing the element having the structure shown in FIG. 4 with the second layer 6 consisting of a 250Å thick film of boron-containing a Si:H produced from a mixed gas of $B_2H_6/SiH_4 = 0.04$ vol%, namely, the 0.04 vol% of diborane gas containing $SiH_4$ gas, and the first layer 3 consisting of a 1 μm thick film of a—Si:H. The line $l_3$ in FIG. 5 shows the property before the formation of an $Si_3N_4$ protective film, and $l_4$ the property after the formation of the $Si_3N_4$ protective film. As is clear from the graph, there is little difference in property before and after the formation of the protective film. When an $SiO_2$ film is used as the protective film, the result is the same. It is considered that the property is not deteriorated because the addition of boron makes the film chemically stable and structurally strong, so that the junction formed between a—Si:H and ITO is prevented from being broken due to the diffusion of indium or the stress of the protective film caused by the formation of the $Si_3N_4$ or $SiO_2$ film, thereby making the junction properties stable. For this reason, the second layer 6 is called a junction stabilizing layer. It has been found that the junction stabilizing layer in a photoelectric transducer element must satisfy the following stringent conditions.

Figure 6:
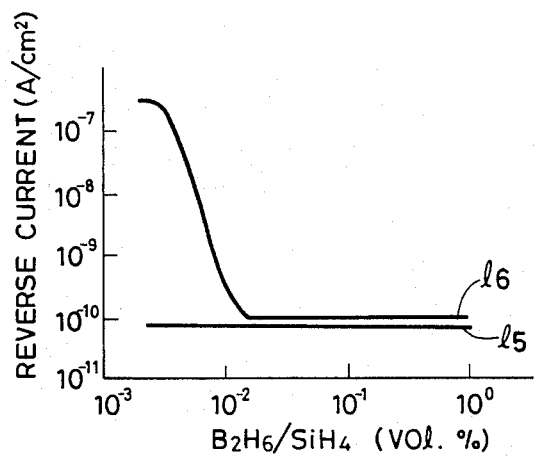
FIG. 6 is a graph showing the relationship between the boron content of the junction stabilizing layer and the reverse current value.

First of all the junction stabilizing layer must not deteriorate the properties even when a protective layer is formed thereon. FIG. 6 shows the results of examining the relationship between the boron content of the junction stabilizing layer and the reverse current of a photoelectric transducer element having the structure shown in FIG. 4. The line $l_5$ shows the property before the formation of an $Si_3N_4$ or $SiO_2$ protective film, while the curve $l_6$ shows the property after the formation of the protective film. The thickness of the junction stabilizing layer is 250Å. As is clear from FIG. 6, if the boron content is less than 0.02 vol%, the property is degraded by the formation of the protective film. Accordingly, the boron content of the junction stabilizing layer must be at least 0.02 vol%.

Figure 7:
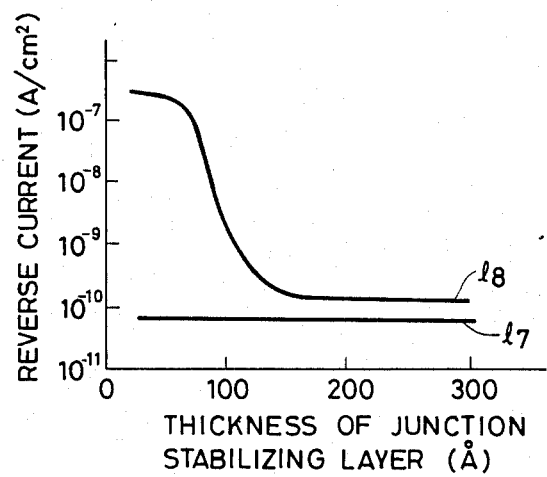
FIG. 7 is a graph showing the relationship between the thickness of the junction stabilizing layer and the reverse current value.

FIG. 7 shows the relationship between the thickness of the junction stabilizing layer of the photoelectric transducer element shown in FIG. 4 and the reverse current, the junction stabilizing layer containing 0.04 vol% of boron. The line $l_7$ shows the property before the formation of an $Si_3N_4$ or $SiO_2$ protective film, while the curve $l_8$ shows the property after the formation of the protective film. As is clear from the graph, the thickness of the junction stabilizing layer must be at least 150Å.

Figure 8:
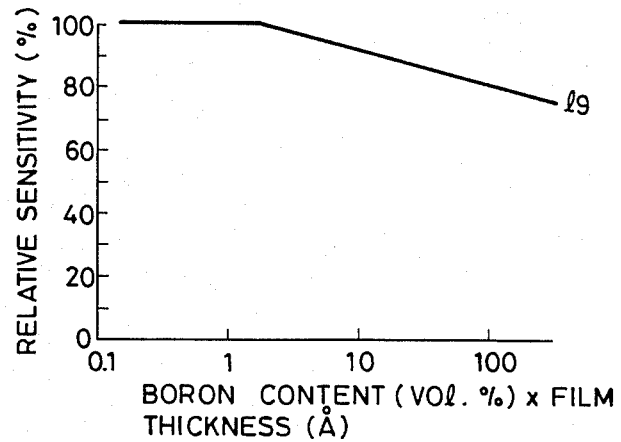
FIG. 8 is a graph showing the relationship between the product of the boron content and the thickness of the junction stabilizing layer and the relative sensitivity of the photosensor.

In a photoelectric transducer element having the structure shown in FIG. 4, the junction stabilizing layer lowers the sensitivity of the photoelectric transducer element. It has been found from the experiments that the sensitivity is lowered in proportion to the product of the boron content (vol%) and the film thickness (Å) of the junction stabilizing layer, as shown in FIG. 8. In a one-dimensional image sensor, more than 10% reduction in sensitivity becomes a serious problem when it is put to practical use. Accordingly, it is necessary to limit the reduction in sensitivity to 10%. To meet this condition. the junction stabilizing layer must meet the following condition, as is obvious from FIG. 8:

Boron content (vol%) × film thickness (Å) < 15. For example, if the boron content is 0.05 vol%, the film thickness must be less than 300Å.

Figure 9:
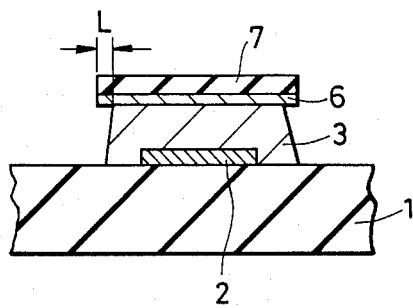
FIG. 9 is a sectional view of the photosensor which explains the eaves of the junction stabilizing layer.
Figure 10:
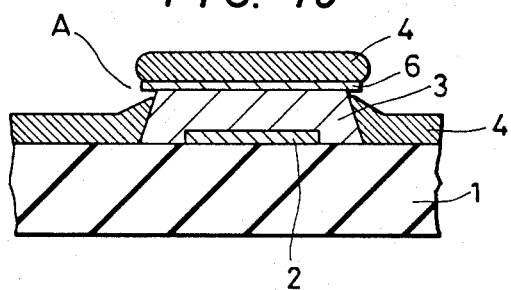
FIG. 10 is a sectional view of the photosensor which explains the disconnection of the transparent electrode due to the eaves.
Figure 11:
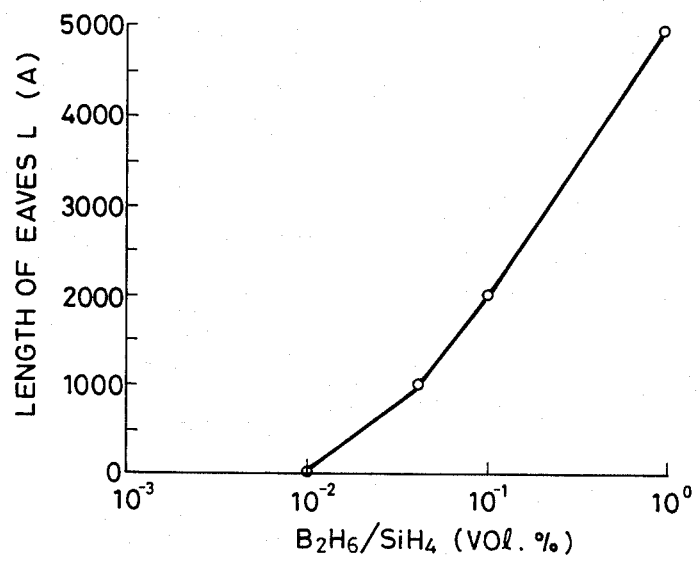
FIG. 11 is a graph showing the relationship between the boron content of the junction stabilizing layer and the length of the eaves.

Secondly, the division of the hydrogenated amorphous silicon layer into two layers produces a serious problem in the patterning process. The a—Si:H layer is ordinarily patterned by dry etching using $CF_4$ gas, wet etching using hydrazine solution or the like. The addition of boron to a—Si:H slows the etching speed. As a result, when etching is conducted with a photoresist 7 fabricated as shown in FIG. 9 as a mask, the width of the junction stabilizing layer 6 becomes larger than that of the a—Si:H photoconductor layer 3, thereby producing the eaves indicated by the symbol L in the sectional view of FIG. 9. If the eaves are large, they produce the disconnection of the transparent ITO electrode 4 which is fabricated on the junction stabilizing layer 6, as shown in FIG. 10. The disconnected portion of the electrode 4 is indicated by the symbol A in FIG. 10. Alternatively, the eaves produce the disconnection of the ITO electrode 4 when the ITO layer is etched. Thus, the eaves greatly reduce the yield. Therefore, the length L of the eaves is preferably short. FIG. 11 shows the relationship between the length L of the eaves and the boron content when the junction stabilizing layer is 250Å thick and the boron content is varied. As is clear from the graph, when the boron content exceeds 0.01 vol%, the length L of the eaves rapidly increases. In an ordinary device, the thickness of the ITO film is 5,000Å or less. To prevent the disconnection of the ITO electrode, the length L of the eaves is preferably at most half the thickness of the ITO film. Therefore, the boron content of the junction stabilizing layer is preferably at most 0.1 vol%.

From the above-described results, it is understood that the junction stabilizing layer preferably satisfies the condition that the boron content x (vol%) is 0.02 to 0.1 vol%, and that the film thickness y (Å) satisfies the relationship xy<15, and is at least 150Å. More preferably, the boron content is 0.02 to 0.04 vol% and the film thickness is 200 to 250Å.

EXAMPLE 1

Figure 12A:
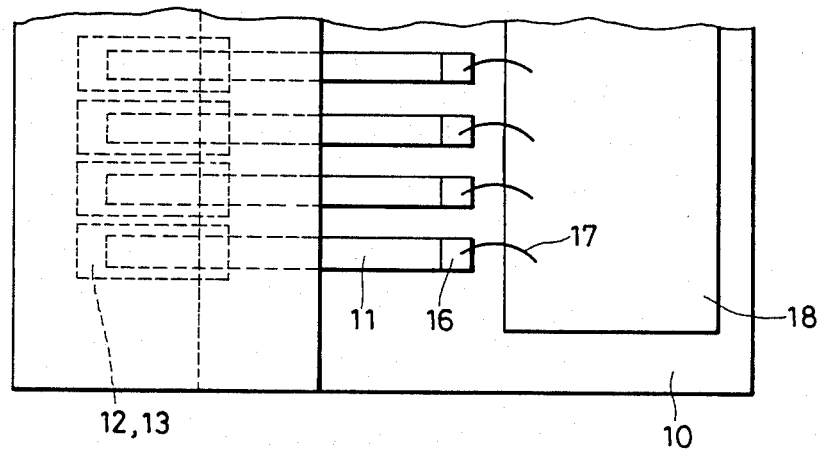
FIG. 12a is a plan view of a one-dimensional image sensor in accordance with another embodiment of the present invention.
Figure 12B:
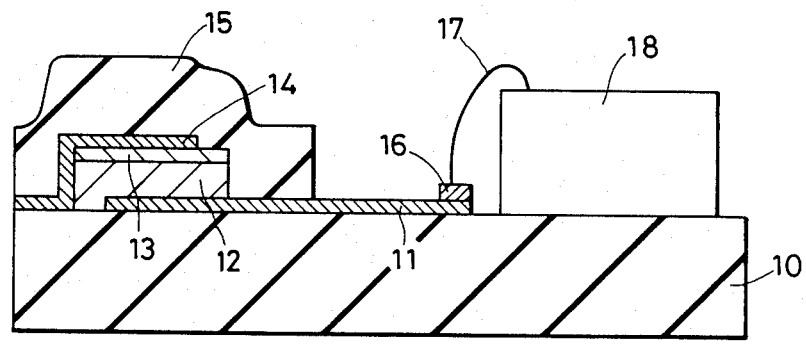

Example 1 relates to a photosensor in accordance with the present invention and, in particular, a one-dimensional image sensor. It will be explained with reference to FIGS. 12a and 12b, which are a plan view and a sectional view, respectively, of the photosensor of the Example 1.

Cr was deposited on an insulating substrate 10 (e.g., glass) to 1,000Å thickness by a sputtering process, and was patterned into a striped electrode 11 of about 70 μm wide stripes by a photoetching process. As the etching agent, ceric ammonium nitrate solution was used. On the electrode formed substrate, an a—Si:H layer 12 and a junction stabilizing layer 13 are formed by plasma CVD, i.e. plasma chemical vapor deposition (glow discharge method). The substrate 10 with the C electrode 11 deposited thereon was placed into the reaction chamber of a plasma CVD apparatus to be heated to 200° C. There was introduced 10 scc (sccm represents standard cc/min) of 100 % concentration of $SiH_4$ gas for glow discharge decomposition, and an about 1 μm thick a—Si:H film 12 was formed. $B_2H_6$ gas was diluted by hydrogen into the concentration of 500 ppm (volume ratio). Then, 4 to 20 sccm of the diluted $B_2H_6$ gas was introduced to form the 150 to 400Å thick junction stabilizing layer 13 by glow discharge decomposition. The boron content in this case was 0.02 to 0.1 vol%. Thereafter, the hydrogenated amorphous silicon layers 12 and 13 were patterned into islands of 100×150 μm² with aqueous solution of hydrazine by a photoetching process. In the aforementioned prior art disclosed in Japanese Patent Laid-Open No. 84457/1983, the hydrogenated amorphous silicon layer is not patterned into islands. In such case, the hydrogenated amorphous silicon layer electrically connects each picture element and thereby produces a large cross talk, so that the properties and, in particular, the resolution of the one-dimensional image sensor are deteriorated.

Therefore, patterning the hydrogenated amorphous silicon layers into islands to separate each picture element is very important. The patterning, however, brings about the above-described new problem of eaves.

After patterning a—Si:H into islands, the photoresist was removed. It is preferable to expose the islands of the hydrogenated amorphous silicon layers to an oxygen plasma atmosphere for several minutes before the removal of the photoresist in order to prevent the leakage current generated on the side surface of the hydrogenated amorphous silicon layers. There was deposited 0.5 μm thick ITO on the substrate with these layers 12, 13 by a sputtering process, and the ITO layer was patterned into an ITO electrode 14 by a photoetching process. A mixture of hydrochloric acid and nitric acid was used as the etching agent. On the substrate with the ITO electrode 14, a protective film 15 was formed by plasma CVD. Employing $SiH_4$, $NH_3$ and $N_2$ gas, the $Si_3N_4$ layer was mask-deposited into 2 μm thickness by glow discharge decomposition to constitute the $Si_3N_4$ protective film 15. Furthermore, an Au layer was formed on the Cr electrode 11 by sputtering to form a bonding pad 16. An IC 18 for scanning was die bonded to the substrate 10, and the photoelectric transducer element and the IC for scanning were connected by wires 17 by wire bonding. In this way the one-dimensional image sensor was completed. In this Example the $Si_3N_4$ film was used as the protective film, but in place of this, 2 μm thick $SiO_2$ film formed by sputtering may be used.

The thus-obtained one-dimensional image sensor of Example 1 had a reverse current, in the dark, of at most $10^{-9}$ A/cm² and an adequately high resolution.

As described above, according to the present invention, it is possible to obtain a photoelectric transducer element in which hydrogenated amorphous silicon is used and which has good properties even if it is covered with an $Si_3N_4$ or $SiO_2$ protective film and it is possible to fabricate a photosensor such as a one-dimensional image sensor having very high reliability using hydrogenated amorphous silicon.

Incidentally, the same numerals denote the same elements in the above drawings.

The present invention is characterized in that the junction stabilizing layer is provided and the photoconductor layer and the junction stabilizing layer as well as the electrode are divided in correspondence with each picture element the occasion demands, and the conventional knowledge and known teachings are adaptable to other features of a photosensor in accordance with the present invention.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A photosensor comprising:
   an electrode consisting essentially of a conductor;
   a photoconductor layer consisting essentially of a hydrogenated amorphous silicon semiconductor which is obtained by the glow discharge decomposition of monosilane gas;
   a juncture stabilizing layer consisting essentially of a hydrogenated amorphous silicon semiconductor which contains boron which is obtained by the glow discharge decomposition of a mixed gas of monosilane and diborane;
   a transparent electrode; and
   a transparent protective layer; all of these elements being laminated in that order on an insulating substrate,
   wherein the content of said diborane gas in said mixed gas is 0.02 to 0.1 vol% on the basis of said monosilane gas content, and the thickness of said junction stabilizing layer satisfies the condition xy<15, wherein x represents the diborane gas content in vol% and y represents the thickness of said junction stabilizing layer an Å, and said thickness is at least 150Å.

2. A photosensor according to claim 1, wherein said transparent protective layer is composed of silicon nitride or silicon oxide.

3. A photosensor according to claim 1, wherein said electrode consisting of said conductor, said photoconductor layer and said junction stabilizing layer are divided into a plurality of islands, the size of said islands being determined by a desired resolving power of said photosensor.

4. A photosensor according to claim 1, wherein said diborane gas content is 0.02 to 0.04 vol%.

5. A photosensor according to claim 1, wherein said thickness of said junction stabilizing layer is 200 to 250Å.

6. A photosensor according to claim 1, wherein said electrode consisting of said conductor, said photoconductor and said junction stabilizing layer are divided into a plurality of islands, the size of said islands being determined by a desired resolving power of said photosensor, such as to be aligned in one-dimensional direction.

7. A photosensor according to claim 1, wherein said photoconductor layer is free of boron.

8. A photosensor according to claim 1, wherein said transparent electrode is an indium-tin oxide layer.

* * * * *